Figure 1:
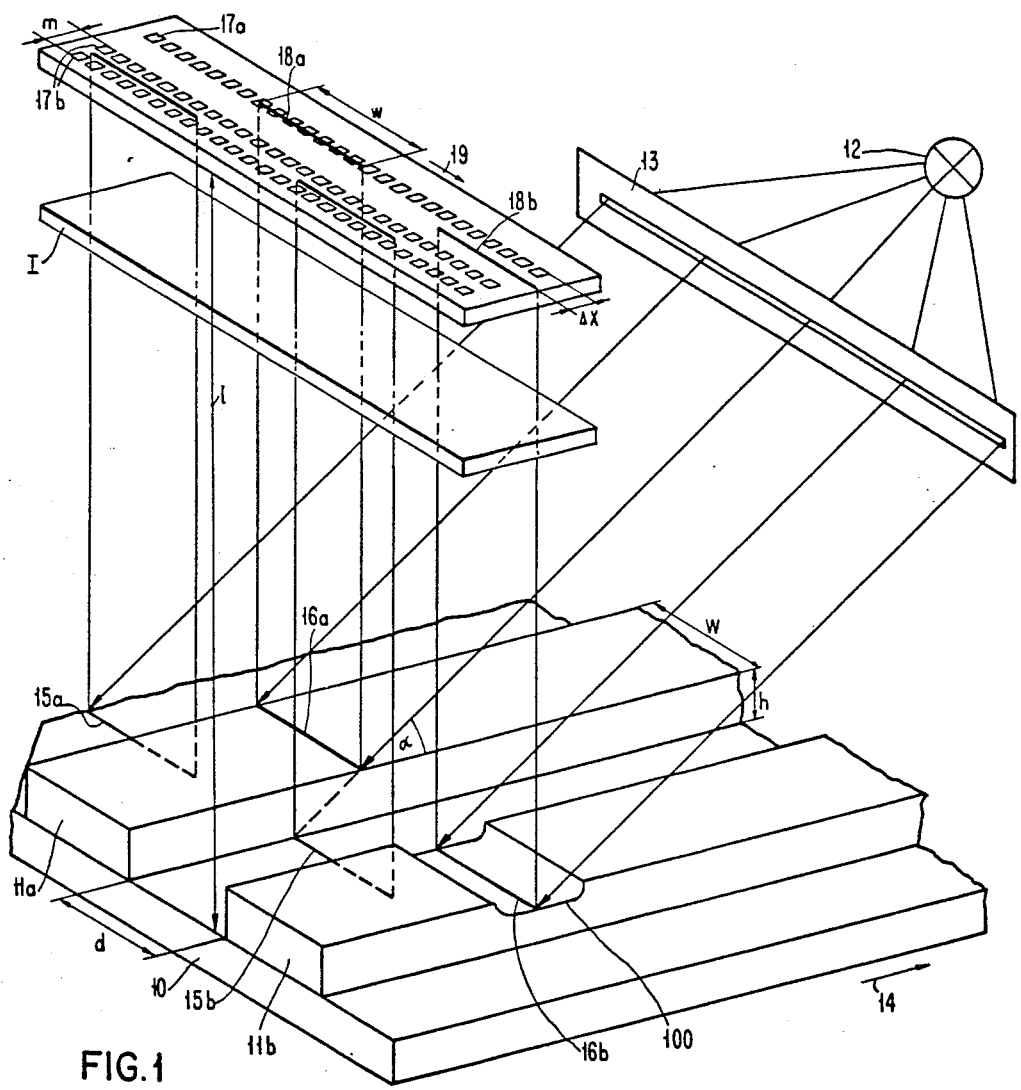

United States Patent [19]

Grammerstorff et al.

[11] Patent Number: 4,583,857
[45] Date of Patent: Apr. 22, 1986

[54] APPARATUS FOR AUTOMATIC OPTICAL PROPERTY TESTING

[75] Inventors: Michael Grammerstorff, Aidlingen; Hans Pietruschka, Rottenburg, both of Fed. Rep. of Germany

[73] Assignee: International Business Machines Corporation, Armonk, N.Y.

[21] Appl. No.: 460,702

[22] Filed: Jan. 24, 1983

[30] Foreign Application Priority Data

Feb. 6, 1982 [DE] Fed. Rep. of Germany ....... 3204086

[51] Int. Cl.$^4$ ............................................. G01B 11/14
[52] U.S. Cl. ......................................... 356/375; 356/1
[58] Field of Search ............................. 356/1, 376, 375

[56] References Cited

U.S. PATENT DOCUMENTS

| | | |
|---|---|---|
| 3,187,185 | 6/1965 | Milnes ..................................... 356/1 |
| 3,612,890 | 10/1971 | Cornyn et al. ....................... 356/376 |
| 3,976,382 | 8/1976 | Westby ................................. 356/376 |
| 4,105,925 | 8/1978 | Rossol et al. ........................ 356/376 |
| 4,188,544 | 2/1980 | Chasson ............................... 356/376 |
| 4,472,056 | 9/1984 | Nakagawa et al. .................. 356/376 |

Primary Examiner—R. A. Rosenberger
Attorney, Agent, or Firm—Stephen J. Limanek

[57] ABSTRACT

For testing substantially two-dimensional relief-structured patterns, in particular circuit boards, an optical scanning head is used which directs a light band according to the light sectioning principle at an angle $\alpha$ to the printed circuit board (10) and in which a linear scanning diode array (17a) is positioned in such a manner that it receives only such light as is reflected by the circuit boards whose surfaces have the nominal height h from the base plate (10). For continuously controlling the operating distance (1) between the linear diode array (17a) and the base plate (10), a pair of linear diode arrays (17b) is arranged parallel to the diode array between which the light reflected at the base plate (10) is incident if the nominal operating distance (1) has been kept and on which this light impinges if deviations of the operating distance have occurred. In each position of the light band, the scanning diode array (17a) is read with respect to the sample and data are fed to an evaluator circuit testing the nominal values of conductor widths and the minimum distances between conductors. Profile test circuits (212) determine whether in the case of deviations from the nominal values there are other permissible geometrical shapes (such as soldering pads).

6 Claims, 7 Drawing Figures

APPARATUS FOR AUTOMATIC OPTICAL PROPERTY TESTING

The invention concerns an apparatus for automatic optical property testing according to the preamble of the main claim.

The visual testing of objects for defects and for determining whether design parameters have been observed is often time-consuming, tedious and error-prone; this holds in particular for the manufacture of complex, substantially two-dimensional patterns, as occur in conductors or lithographic masks. The plurality of structural elements to be tested in such patterns and the necessity of having to test each finished item renders the sampling out of defective parts very difficult and may lead to substantial consequential cost if defective intermediate products are used, whose defects become apparent only after a number of further manufacturing steps.

Particularly important is the optical property testing of circuit boards or cards consisting of several layers with conductor patterns of their own (so-called multilayer cards); the conductance test used for the individual conductors often proves inconclusive or positive, if individual dimensions, for example, the minimum distance between two conductors, have not been observed throughout. However, in many cases, such defects become apparent only after the board has been used for a longer time if, for example, an interruption occurs at such defective points as a result of a short-circuit caused by electromigration or as a result of mechanical stress.

For testing circuit boards and similar substantially two-dimensional patterns, two basic approaches are known from the art. The first provides for a finished component to be compared point-by-point with a non-defective sample, thus detecting any deviations that might exist. Such a system is described, for example, in the article by E. Krochmann and P. Wirz "Automatischer Vektordistanzkomparator VDK Projectina" published in Feinwerktechnik & Messtechnik 84 (1976), Vol. 7, page 330. However, this method has the disadvantage that sample and pattern must be very accurately aligned to each other and that even in such cases many deviations (such as non-detrimental small relative displacements of individual partial areas within the pattern) not impairing the function of the tested component are detected as defects. Apart from this, such tests are relatively time-consuming. Instead of being directly optically compared, the sample can also be scanned by means of an image transducer, comparing the digitalized image obtained with a stored digital representation of the pattern.

A further test method provides for relatively small surface sections to be tested to determine whether the design parameters applicable to the respective pattern have been observed. Such a test extends, for example, to the minimum and maximum conductor cross-sections, the mutual conductor spacings and the occurrence of permissible larger conductor regions, such as soldering pads. This method is particularly suitable for regularly structured patterns in circuit boards and the like, as for these the test criteria are relatively simple and the number of circuits used is kept to a minimum. During digital image processing, this eliminates the high-capacity storage required for storing the pattern data. An example of such an opto-electronic test system for the automatic property testing of circuit boards is described in European Patent Application 23 574.

The methods and systems described in the prior art for optical property testing are limited to the two-dimensional image of the object to be tested, such as a circuit board, which is produced when the sample is scanned, for instance, by means of a TV camera. However, in actual fact the conductors of a circuit board are three-dimensional structures, whose thickness is another essential design parameter which must not exceed certain limits; if the nominal thickness is less than a predetermined value, a current passing as a result of electromigration may interrupt the conductor after some time; on the other hand, if the thickness exceeds a predetermined value, there may be problems with laminating the intermediate layers into the final circuit board.

As during the processing of digitalized images many picture elements have to be stored, read out, processed and written back, existing visual inspection systems are too slow to be employed for manufacturing purposes.

Therefore, it is the object of the present invention to provide a system for automatic property testing of the kind described above, which permits monitoring also the third dimension (height) in a pattern to be tested and which is such that testing can be effected rapidly, using relatively simple means.

This object is accomplished by the invention characterized in the main claim; embodiments of the invention are characterized in the subclaims.

The proposed test system uses an optical scanning head with light sectioning means for scanning the sample, for example, a circuit board, line-by-line. The scanning head comprises two arrangements of linear diode arrays positioned closely adjacent to each other. The first arrangement receives the light reflected from the surface of the insulating base plate in response to obliquely incident illumination and the second the light reflected at the surface of a conductor, provided the latter is at the desired nominal height. The output signals of the linear diode arrays are converted into binary values according to an adaptively varying threshold value and fed to evaluator circuits testing whether the nominal dimensions have been observed in the two-dimensional image. To increase the processing speed, the test for permissible image features is carried out in parallel by several evaluator circuits each associated with one image feature. Defects detected are marked and may be displayed on a TV screen.

The proposed test method permits determining all relevant design parameters of a substantially two-dimensional image with a relief-like height structure; as only the linear diode array just scanned is to be processed, the processing speed of the entire system is so high that evaluation and scanning are effected at the same time. The circuits required are few, as no extensive reference data (samples) have to be stored and compared with the actual data. The optical resolution obtainable by means of the diodes presently available is in the range of several $\mu$.

Figure 3:
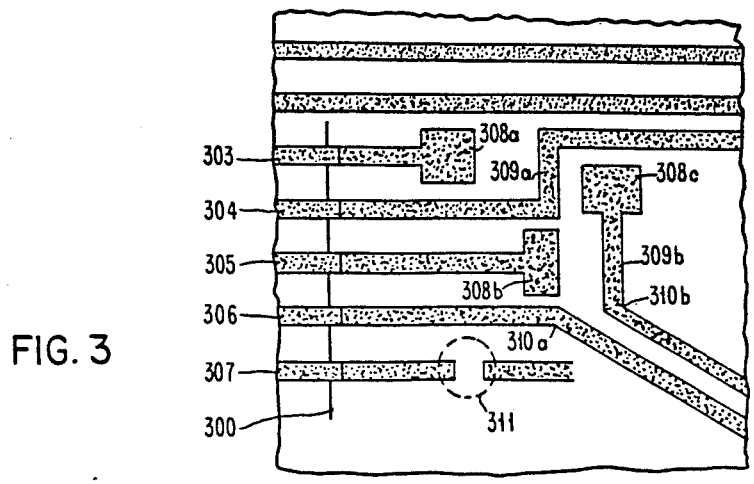
Figure 2:
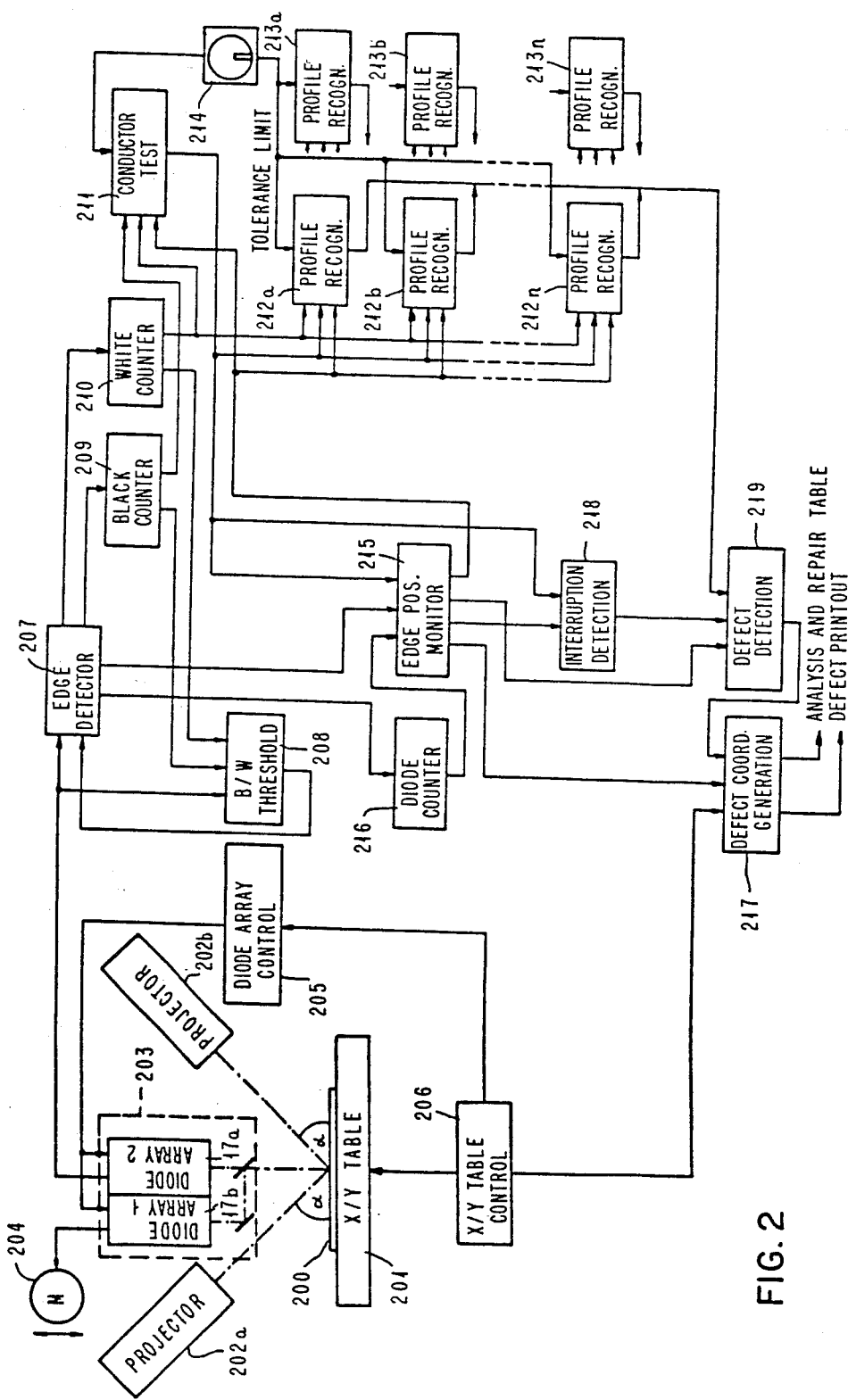
Figure 4A:
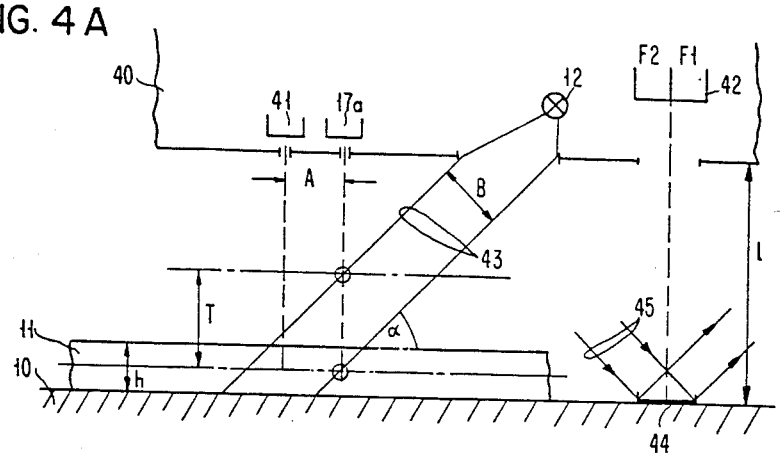
Figure 4B:
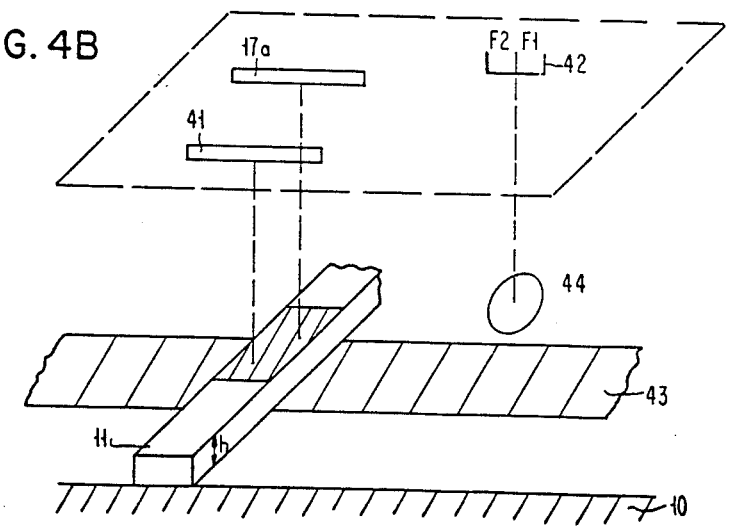
Figure 5:
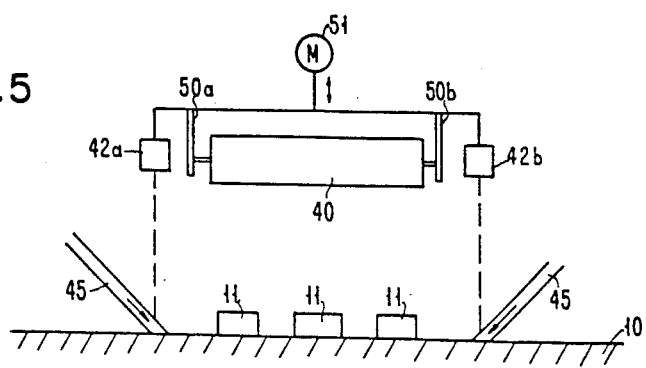
Figure 6:
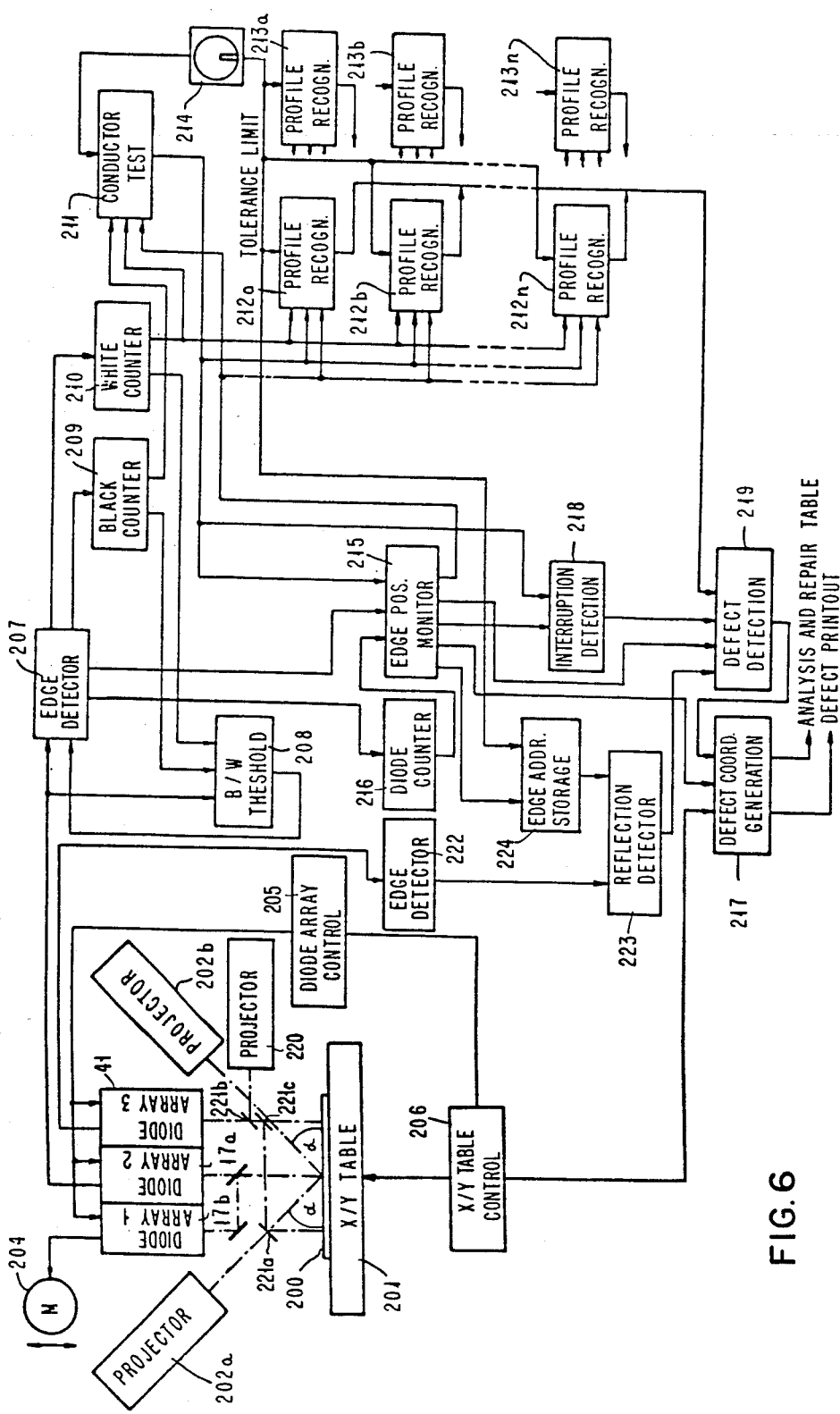

Embodiments of the invention will be described in detail below with reference to drawings, in which FIG. 1 is a perspective diagrammatic drawing of the optical scanning head with light sectioning means according to the invention, FIG. 2 is a block diagram of an opto-electronic inspection system with a scanning head according to FIG. 1, FIG. 3 is a detail drawing of a circuit board, FIGS. 4 A,B are lateral and perspective views of a further embodiment of the invention using a wide light band, FIG. 5 is a front view of the scanning head, illustrating its mechanical suspension, FIG. 6 is a block diagram of an embodiment of the invention, by means of which metallized regions between the conductors can be compared.

FIG. 1 is a perspective detail representation of a circuit board consisting of an insulating base plate 10 and several conductors 11a and 11b, arranged thereon, which are made, for example, of copper. The width w, the height h and the mutual spacing d of these conductors 11a, 11b are to be tested across the entire circuit board to determine whether they meet permissible values. For this purpose, the board is illuminated with a light band. This light band, generated by a lamp 12 and a slit diaphragm 13 following the lamp, forms an angle of incidence $\alpha$ with respect to the circuit board. The angle of incidence $\alpha$ is preferably approximately $\alpha \approx 45°$ and the light band is oriented perpendicularly to the longitudinal axis of the conductors 11. By means of this light band, the whole surface of the circuit board is meander-scanned by shifting, for example, the circuit board either continuously or in steps in a direction perpendicular to the light band (arrow 14). The length of the generated light band is several cm, its width several $\mu$m and above. An optical imaging system between slit diaphragm 13 and sample 10 produces a sharply defined image of the slit. Instead of the slit diaphragm, it is also possible to use an array of light wave conductors (optical fibers) for generating a slit-shaped light source.

The portion of the light band impinging upon the surface of the base plate 10 is illustrated in FIG. 1 with the straight sections 15a, 15b. When impinging upon the surface of the conductors 11a, 11b, the light band, incident at an angle $\alpha$, produces the straight sections 16a and 16b, respectively, which, viewed perpendicularly towards the circuit board, are displaced by the horizontal distance $\Delta x$, this displacement depending upon the respective height h of the conductor as follows:

$$\Delta x = \frac{h}{\tan \alpha}.$$

The illuminating system, consisting of the lamp 12 and the slit diaphragm 13, is rigidly connected to two linear diode arrays 17a, 17b which are positioned relative to each other in such a manner that at a fixed operating distance 1 of the linear diode arrays from the base plate 10, the linear diode array 17a receives the light reflected at the surface of those conductors whose height just corresponds to the desired nominal height. In this position, the median of the light band and the normal extending through the linear diode array relative to the conductor surface intersect each other at the nominal height of the conductors. The linear diode array 17b consists of a pair of diode arrays arranged parallel to the diode array 17a and having a mutual spacing m. The line of symmetry of the double array 17b is spaced from the diode array 17a such that at an operating distance 1 the light reflected at the base plate 10 just impinges upon the line of symmetry of the double array 17b. If the operating distance 1 changes, the light reflected at the base plate 10 migrates from that line, impinging upon one or the other of the linear diode arrays 17b, depending upon whether the operating distance 1 increases or decreases. The output signals of the double diode arrays 17b are subsequently used as control signals for restoring the nominal operating distance 1. This distance is a prerequisite for the test described below which serves to determine whether the nominal height h has been observed for the conductors. To avoid control errors, a control signal is generated only after illumination of a minimum number of diodes in the double array 17b.

An optical imaging system I is arranged between the diode arrays 17 and the sample. For aligning the components of the scanning head relative to the sample to be tested, adjusting means may be provided.

As previously mentioned, at a predetermined operating distance 1 the geometrical configuration of light source and diode arrays is chosen in such a manner that reflection of the light band at a conductor 11a with the nominal height h causes an image 18a to be generated at the diode array 17a. If the light band impinges, for example, in section 16b, on a conductor, whose height does not correspond to the nominal height h, as shown, for instance, in the indentation 100 of the conductor 11b, the reflected light band 18b does not reach the diode array 17a but is deflected either to its left or right, depending upon the direction of the height deviation. The magnitude $\Delta x$ of this deflection depends on the amount by which the actual height of the conductor differs from the nominal height. The displacement $\Delta x$ need not be accurately determined if testing of the conductor height is limited to monitoring the nominal height range. The tolerance range to be observed for the nominal height may be adjusted by suitably choosing the light-sensitive surface of the diodes and/or the width of the light band. Typical values of the tested height range are several 10 $\mu$m at a tolerance limit of several $\mu$.

When the circuit board is scanned in steps, the charge image of the diode array 17a, which is produced by exposure, is evaluated; for this purpose, the diode array is sequentially read (in the direction of the arrow 19), the output signals are converted into binary values and fed to evaluator circuits which determine whether the width of the light and dark pattern received from the linear diode array 17a corresponds to the nominal width of the conductors and the nominal spacings.

Details of the evaluator circuit for the signals read from the diode arrays 17a will be described below with reference to FIG. 2 which is a block diagram of the individual components of a complete system for the automatic property testing of circuit boards. The circuit board 200 to be tested is positioned on an X-Y support (X-Y table) 201 and is illuminated by two projectors 202a, 202b, arranged symmetrically to its normal, with one light band each which impinges upon the circuit board at an angle $\alpha$. Duplication of the light band projectors prevents the occurrence of undesired shadow areas, for example, in the case of rough surfaces. The light reflected at circuit board 200 is recorded by a scanning head, positioned perpendicularly above the circuit board and comprising the linear diode arrays 17a and 17b described by means of FIG. 1. The output signals of the double diode array 17b are applied as control signals to a motor 204, by means of which the operating distance between scanning head 203 and circuit board 200 is kept constant. The X-Y support 201 is preferably continuously shifted by a table control 206; after each shift by 12$\mu$ the diode array control 205, connected to the table control, emits an output signal to the diode arrays 17a, 17b. The entire circuit board 200 is preferably guided in meander fashion underneath the light bands of the projectors 202a, 202b.

The charge distribution in the diode array 17a represents the local brightness distribution of the light band reflected at the circuit board 200 and is serially fed to an edge detector 207 for evaluation. By means of this edge detector, the anlogue values of the diode signals are converted into binary values according to a continuously updated threshold value. Control of the respective black and white threshold value is effected by circuit 208 in such a manner that if an edge is encountered, the signals of a predetermined number of diodes to the left and right of the edge are summed, forming a mean value from the sum thus obtained. This mean value is selected as the present threshold value for the binary conversion of the subsequent diode signals, so that changes of illumination or the local reflection properties of the circuit board 200 do not lead to a displacement of the edge position in the diode image.

The binary output signal of the edge detector 207 is fed to two counters 209, 210, by means of which the successive light and dark (black and white) elements in the binary image, produced from the output signals of the scanned diode array 17a, are counted. The output signals of the counters 209, 210 are fed to the circuit 208 for controlling the black and white threshold, in order to establish the respective fixed number of picture elements to the left and right of an edge; in addition, the counters 209, 210 are connected to a circuit 211 determining whether the nominal values for the conductor width and the mutual spacings of the conductors have been kept. This test is effected in a simple manner by comparing the length of the continuous light and dark sections of the binary signal with predetermined values. The given or reference values for the different types of circuit boards to be tested can be stored in a diskette station 214 and be transferred to circuit 211 at the beginning of the test.

Test circuit 211 also receives the output signals of an edge position monitor 215, with whose help it is possible to distinguish between the different conductors simultaneously subjected to a light band. In the example of FIG. 3, conductors 303 to 307 are simultaneously tested in one scanning position (line 300 corresponding to the image of the reflected light band); the edge position monitor contains the relevant information on the edge position of each conductor, so that in the subsequent scanning step the edges determined can be appropriately associated with the respective conductors. The output signals of the edge detector 207 and the test circuit 211 as well as the count of a diode counter 216, receiving data from edge detector 207, are fed as input sigals to monitor 215. The diode counter supplies the address of the respective edge which is stored in monitor 215 until the next scan.

If the test circuit 211 determines conductor widths and conductor spacings that are outside the permissible range, this does not necessarily mean that the conductor image is defective. In addition to the conductors, the circuit board comprises a series of further permissible geometrical shapes of conductor elements, such as soldering pads (designated as 308a, 308b and 308c in FIG. 3) or rectangularly or obliquely bent conductors 309a, 309b, 310a and 310b. To increase the processing speed, a profile recognition circuit 212a to 212n is provided for each of the profiles in question. In addition, a set of these profile recognition circuits is provided for each conductor (e.g., 303–307 in FIG. 3) handled during a scan. If the test circuit 211 detects a value which is outside the permissible range, it activates the group of profile recognition circuits, for example, 212a–212n, associated with the respective conductor. These recognition circuits then determine in a further scan whether the values objected to by test circuit 211 concur with any one of the permissible profiles. If, for example, a soldering pad 308 is scanned, the associated profile recognition circuit emits a "found" signal after the light band has passed the entire soldering pad. In the case of non-permissible profiles, none of the profile recognition circuits 212 emits a "found" signal, so that the defect detection circuit 219, connected to the outputs of the profile recognition circuits 212, 213 . . . , indicates a defect. The profile recognition circuits 212, 213 may be adjusted to the respective permissible profiles for a circuit board by means of reference data from diskette station 214.

An interruption of a conductor, for example, in region 311 of the conductor array 307 of FIG. 3 is detected by an interruption detection circuit 218 to which the input signals from the test circuit 211 and the edge position monitor 215 are applied. The test circuit 211 is not capable of detecting such defects on its own, as at that point the diode array 17 has only a larger spacing between some conductors (which is permissible per se). The interruption detection circuit 218 meets the requirement that the conductors must not be butt-ended but terminate in a soldering pad or another suitable geometrical shape.

The defect detection circuit 219 receives all signals indicating irregularities (non-permissible profiles, faulty edge positions, interrupted conductors). The location of each defect is determined by means of the table coordinates supplied by the table contol 206 and serves to generate a defect protocol and/or to adjust an analysis and repair table on which the defective circuit board 200 is placed, so that the defective spot is automatically located.

If several height levels are to be monitored in a sample, a suitably adjusted scanning diode array (17a) is provided for each level.

In modification of the previously described embodiments with a very narrow light band (width of the order of $10\mu$), it is also possible to use wider light bands of up to $100\mu$ and over, if the permissible conductor heights cover a relatively wide tolerance range. In the lateral view of FIG. 4A, a conductor 11 positioned on the base plate 10 is illuminated with a light band 43 of the width B, which is generated by a light source 12, using suitable optical imaging means and diaphragams. As previously, this light band is incident on the conductor at an angle $\alpha$, The nominal height h of the conductor 11 may vary over a range T. In such a case, the diode array 17a is arranged perpendicularly above the intersections of the light band boundaries with the boundaries of the the permissible value range T. If the diode array 17a receives no light, the conductor height h is outside the permissible value range.

For light bands of such widths, the height control of the substrate described in the previous embodiments is no longer practicable. Instead, an optical bridge circuit is used, wherein a photodetector 42, located in scanning head 40, has two adjacent photosensitive surfaces F1 and F2 which are adapted to each other. This photodetector receives light from an elliptical region 44 which is illuminated by a circular laser beam 45 obliquely incident on the base plate 10. If the base plate 10 maintains its nominal spacing 1 from the scanning head of the present invention, both photosensitive surfaces F1 and F2 face the same portion of the elliptical region of incidence, so that a connected electrical bridge circuit does not supply an output signal. If distance 1 is changed, the position of the elliptically illuminated region changes too, so that the photosensitive surfaces F1 and F2 are non-uniformly illuminated, emitting an output signal which may be used for height control. This output signal is a continuously changing analogue value and permits adjusting the height very rapidly so that even minor irregularities ($<<10$ μm) of the base plate may be compensated for. A further advantage of this arrangement is that it is insensitive to changes of the local reflection characteristics of the circuit board. If the actual height of the base plate is changed, both output signals of the photosensitive surfaces F1, F2 change, but in an opposite sense. If, on the other hand, a highly reflecting conductor surface is scanned, first one and then the other output signal changes, with the respective other signal remaining constant. This height control feature can be utilized in a connected logic circuit.

The scanning head 40 of the embodiment of FIG. 4A comprises a further linear diode array 41 which is arranged at a spacing A parallel to the linear diode array 17a. Diode array 41 serves to determine whether base plate 10 comprises, in addition to permissible conductors, further metallized regions which are outside the permissible height range of the conductors and thus cannot be "seen" by the linear diode array 17a. Such metallic surfaces may be, for example, thin copper residues between the actual conductors which, since they were incompletely etched, may give rise to short-circuits. For the conditions shown in FIG. 4A the visual field of the linear diode array 41 extends from the base plate (i.e., height 0) up to a value above the illustrated conductor height h. Other visual fields of this diode array may be adjusted by suitably selecting the spacing A and/or the width B of the light band.

As diode array 41 thus is capable of recognizing also a part of the regular conductors, it is necessary for these conductors, which are also recognized by diode array 17a, to be electronically considered (i.e., to be subtracted from the visual field of the diode array 41), so that it is only when a metallized region outside the conductor regions is processed that the output signal of diode array 41 leads to a defect signal. The circuit necessary for this electronic processing will be described in detail further on by means of FIG. 6.

FIG. 4B shows, in a highly schematized form, a perspective view of the previously described light sectioning process with wide light bands marked by hatched lines in FIG. 4B. The reference numerals of FIG. 4B correspond to those of FIG. 4A.

FIG. 5 is a schematic front view of an optical inspection system of the type described by means of FIG. 4A, wherein the scanning head 40 moves perpendiculary to the plane as drawn. Head 40 is suspended by means of piezolelectric elements 50a, 50b which are actuated by control signals of the photodiodes 42a, 42b and thus permit the height being rapidly adjusted as the height of base plate 10 changes. This system also permits corrections if base plate 10 is obliquely positioned. Larger height differences detected as the scanning head passes base plate 10 may be compensated for by means of the motor M indicated at reference numeral 51 which raises or lowers the entire system with head 40, piezoelectric elements 50 and photodetectors 42. For this purpose, sensors 42a, 42b are positioned in such a manner that viewed in the direction of movement, they are positioned slightly outside the area of incidence of the light band, so that in the case of bent base plates, there is sufficient time to correct the nominal height until the scanning head reaches the illuminated point of the base plate. The output signals of the optical sensors are processed in a logic circuit (not shown) prior to being used as control signals for the piezoelectric elements 50.

FIG. 6 is a schematic overall representation of an apparatus for optical property testing, comprising an additional linear diode array 41 detecting metallizations existing between the conductors. This additional diode array explained by means of FIG. 4A can also be used in a scanning head processing narrow light bands, as explained by means of FIG. 1. In this case, an additional projector 220 is used (in place of the projector it is also possible to couple out part of the light of projectors 202a or 202b) which generates a further narrow light band that is perpendicularly incident on the circuit board and that extends behind the linear diode array 17a, viewed in the direction of movement. In FIG. 6, the reflecting mirrors 221a to 221c are used for this purpose; mirror 221c being movable for adjusting the beams as previously described. The output signal of the additional diode array 41 is evaluated in an edge detector 222, whose function corresponds to that of the previously described edge detector 207. The test for metallized regions between the actual conductors is effected in a logic circuit 223 which receives the metallized regions that were detected by circuit 222 and delayed in a storage 224, in order to compensate for the time lag of the output signals of the diode array 41 which, viewed in the direction of movement, is arranged behind the linear diode array 17a. In logic circuit 223, the metallized regions detected as conductors are subtracted from the metallized regions detected by diode array 41. If the difference does not equal 0 (or is above a predetermined threshold value), this is indicative of an undesired metallization between the conductors, and circuit 223 emits a defect signal to the defect detection circuit 219.

We claim:

1. Apparatus for the automatic optical property testing of substantially two-dimensional relief-structured patterns, characterized in that an optical scanning head is positioned at a fixed operating distance (1) above a test pattern including a base plate having an object thereon of nominal height (h) above said plate movable relative to said head, said scanning head directing a light band, obliquely incident at an angle α, to said base plate and comprising a first linear photodiode array arranged parallel to said light band and perpendicularly above the intersection of the light band with the plane corresponding to said nominal height (h) in which the light reflected from said object is incident if the nominal height (h) is maintained, and a pair of second diode arrays arranged parallel to said first linear photodiode array, with a mutual spacing (m) in which the light reflected at said base plate is incident if the operating distance (1) has been kept, and that the output signals of said second diode array pair act as control signals for restoring the operating distance (1).

2. Apparatus according to claim 1, characterized in that the light band has a width of the order of 10 μm.

3. Apparatus according to claim 1, characterized in that the output signal of said first linear photodiode array (17a) is fed to an edge detector (207) generating a binary representation of the output signals of said first linear photodiode array (17a) by means of an up-dated black and white threshold value.

4. Apparatus according to claim 3, characterized in that continuous light and dark areas, respectively, of the binary representation are evaluated by edge-triggered counters (209, 210) and the counts are compared with predetermined nominal values (test circuit 211).

5. Apparatus according to claim 7, characterized in that test circuits for permissible patterns (profile recognition circuit means 212) are triggered if the nominal values are exceeded during the evaluation of the binary representation.

6. Apparatus according to claim 1, characterized in that the scanning head (40) comprises a fourth linear diode array (41) which is arranged parallel to said first linear photodiode array (17a), said fourth diode array (41) being positioned perpendicularly above the intersections of the boundary lines of the light band (43) with a further permissible height range, and that the output signals of said fourth linear diode array are fed to a further edge detector (222), whose output signals together with the signals generated by the first edge detector (207) are processed in a reflection detector (223).

* * * * *